(12) United States Patent
Sersch

(10) Patent No.: US 9,288,918 B2
(45) Date of Patent: Mar. 15, 2016

(54) MOBILE DEVICE IN WHICH THE INTERIOR SWITCH ELEMENT IS PROTECTED BY THE HOUSING

(75) Inventor: Jürgen Sersch, Solingen (DE)

(73) Assignee: HUF HULSBECK & FURST GMBH & CO. KG, Velbert (DE)

( * ) Notice: Subject to any disclaimer, the term of this patent is extended or adjusted under 35 U.S.C. 154(b) by 192 days.

(21) Appl. No.: 14/114,423

(22) PCT Filed: Feb. 27, 2012

(86) PCT No.: PCT/EP2012/053258
§ 371 (c)(1),
(2), (4) Date: Oct. 28, 2013

(87) PCT Pub. No.: WO2012/146407
PCT Pub. Date: Nov. 1, 2012

(65) Prior Publication Data
US 2014/0055237 A1     Feb. 27, 2014

(30) Foreign Application Priority Data
Apr. 27, 2011  (DE) .......................... 10 2011 002 286

(51) Int. Cl.
*H05K 5/00*   (2006.01)
*G07C 9/00*   (2006.01)
*G05G 1/02*   (2006.01)

(52) U.S. Cl.
CPC ................ *H05K 5/0086* (2013.01); *G05G 1/02* (2013.01); *G07C 9/00174* (2013.01); *G07C 9/00944* (2013.01); *G07C 2009/00952* (2013.01); *Y10T 29/49826* (2015.01)

(58) Field of Classification Search
CPC ........... G07C 9/00944; G07C 9/00174; G07C 2009/00952; H05K 5/0086; G05G 1/02; Y10T 29/49826
USPC ........................................................ 340/5.64
See application file for complete search history.

(56) References Cited

U.S. PATENT DOCUMENTS

| | | | | |
|---|---|---|---|---|
| 2002/0125112 A1* | 9/2002 | Takezawa | ...................... | 200/6 A |
| 2004/0145450 A1* | 7/2004 | Katagiri et al. | .............. | 340/5.72 |

(Continued)

FOREIGN PATENT DOCUMENTS

| | | |
|---|---|---|
| CN | 1862962 A | 11/2006 |
| CN | 101443820 A | 5/2009 |

(Continued)

OTHER PUBLICATIONS

Translation of DE 19964166, Barrenberg, Housing for Electronic Key, Aug. 16, 2001.*

(Continued)

*Primary Examiner* — Edwin Holloway, III
(74) *Attorney, Agent, or Firm* — Cantor Colburn LLP

(57) ABSTRACT

The invention relates to a mobile device (10) for activating at least one switch element (40) that is arranged inside a housing (11), having a key unit (20) that comprises at least one contact means (21), wherein the contact means (21) is aligned to the interior (12) of the housing (11) in order to activate the switch element (40), and having a receptacle (13) arranged on the housing (11) to which the key unit (20) is fastened. According to the invention, the receptacle (13) comprises a force transfer region (14) that is arranged between the key unit (20) and the switch element (40) such that the interior (12) of the housing (11) is protected from the outer region (2).

14 Claims, 2 Drawing Sheets

(56) References Cited

U.S. PATENT DOCUMENTS

| | | | |
|---|---|---|---|
| 2009/0173613 A1* | 7/2009 | Geldmacher | 200/5 A |
| 2010/0123549 A1* | 5/2010 | Lickfelt et al. | 340/5.64 |

FOREIGN PATENT DOCUMENTS

| | | |
|---|---|---|
| DE | 19964166 C1 | 8/2001 |
| DE | 10121045 A1 | 11/2002 |
| DE | 10131500 A1 | 4/2003 |
| DE | 102005014563 A1 | 9/2006 |
| DE | 102008025033 A1 | 11/2009 |

OTHER PUBLICATIONS

Chinese Office Action issued Mar. 18, 2015 re: Chinese Application No. 201280020753.8.

International Search Report for corresponding application PCT/EP2012/053258 filed Feb. 27, 2012; Mail date Apr. 26, 2012.

* cited by examiner

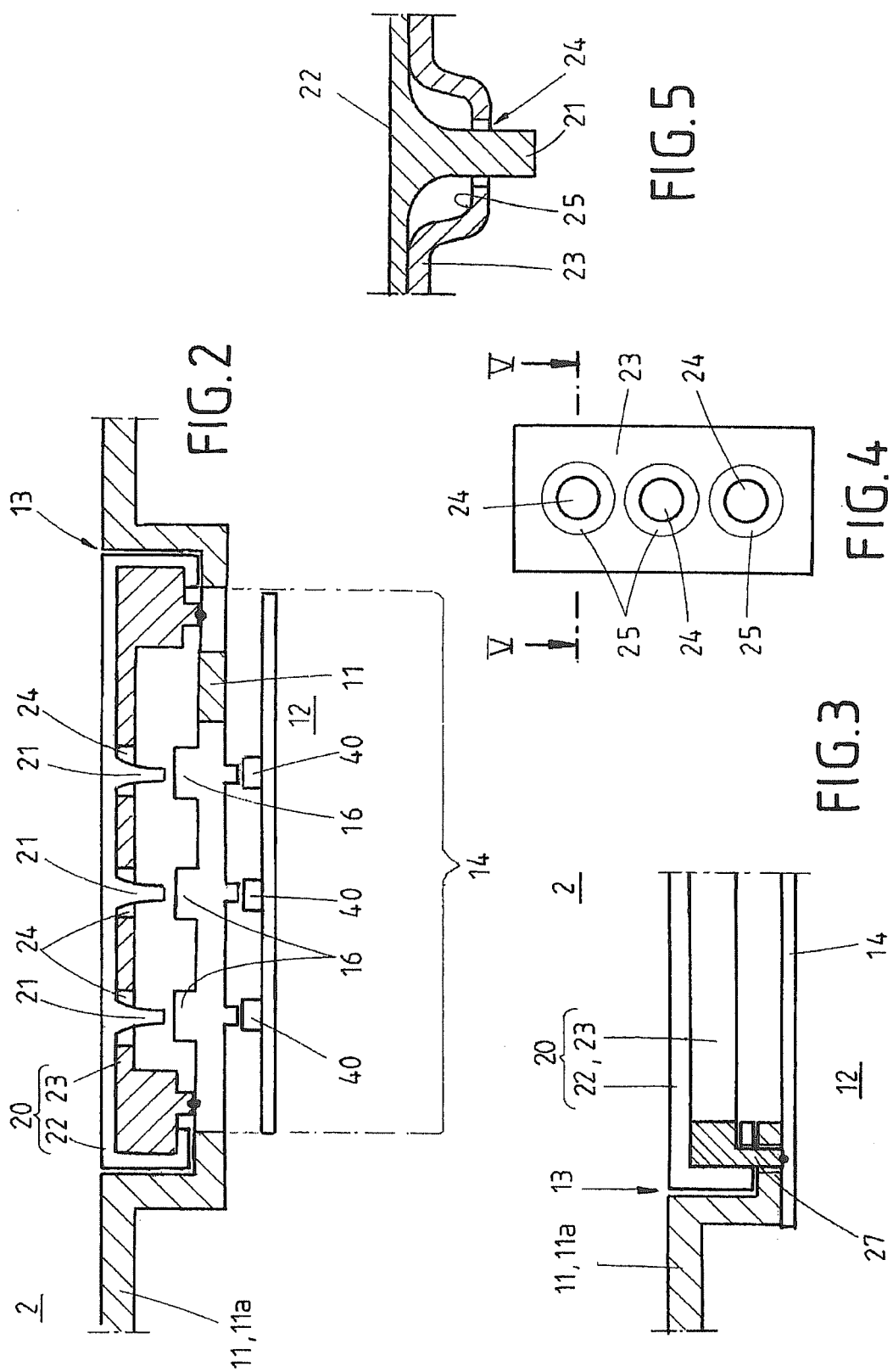

MOBILE DEVICE IN WHICH THE INTERIOR SWITCH ELEMENT IS PROTECTED BY THE HOUSING

TECHNICAL FIELD

The invention concerns a mobile device for the activation of at least one switching element that is arranged inside a housing, with a keypad which has at least one contacting device, whereby the contacting device is directed towards the inside of the housing so as to activate the switching element, and a receptacle that is arranged on the housing on which the keypad is fixed.

BACKGROUND

In DE 101 21 045 C2, an ID-transmitter is disclosed, in which a keypad is fixed within a housing. A plunger is mounted on the keypad. On operation, this plunger serves to activate a switching element, by which the elastic key is moved by the plunger against the switching element. The keypad is fixed to an edge of a support. The support has snap-on elements which serve in fixing on the housing. The ID-transmitter shows to its advantage that it can be mounted safely and easily, whereby at the same time a perfect sealing is achieved, since the keypad completely closes the opening of the housing.

BRIEF SUMMARY

It is the task of the present invention to make a mobile device, whereby the effort required during manufacture and/or during assembly is further reduced and at the same time a perfect sealing is achieved, particularly in the region of the housing of the key unit.

As per this invention, it is envisaged that the receptacle has a force transmission area that is positioned between the key unit and the switching element in such a way, that the interior of the housing is protected from the outer area. If the key unit is activated from the outside by the user, particularly if the user presses on the key unit, a corresponding movement of the contacting device takes place in the direction of the interior of the housing, whereby at the same time the contacting device acts on the force transmission area. With that, the force transmission area is momentarily deformed in the direction of at least one switching element that is inside the housing, particularly elastically and/or flexibly deformed, due to which a corresponding contact with the switching element takes place. Since the force transmitting element fully separates the interior area from the outer area of the mobile device, it is ruled out that moisture, dirt particles, etc. can ingress into the region of the housing in which the key unit is located. Thus, as a rule, the electronics inside the mobile device, inclusive of circuit board, switching elements, sensors, battery, etc. are simply and effectively sealed from the outer areas, whereby at the same time the assembly of the key unit in the receptacle is simplified, since the fastening of the key unit lies completely in the outer area of the mobile device and therefore there are no particularly stringent requirements for the fastening of the key unit to the housing to ensure a sealing of the interior of the housing.

In one possible version of the invention, the housing and the force transmission area can form a combined, two-component structural element. The force transmission area is located, at least in certain zones, in the receptacle of the housing. In this embodiment of the invention, the housing and the force transmission area advantageously form a monolithic structural element, so that the interior of the housing is fully separated from the outer area of the mobile device by the monolithic structural element. The two-component structural element thus fully encapsulates the interior area of the mobile device, which includes, among other things, electronic components. Due to this, a reliable sealing can be achieved.

An advantageous design of the invention could be such that the force transmission area is made out of a first material and the housing out of a second material, whereby the first material has a lower mechanical resistance than the second material. The first material and/or the second material could be made up of a mixture of plastics. In an advantageous version of the mobile device, the first material can be a silicone or a thermoplastic polymer. The force transmission area of the receptacle can, for example, be made out of a thermoplastic elastomer (TPE) or a thermoplastic elastomer on urethane basis (TPU).

One measure to improve the invention could be that the key unit is at least made out of a flexible and/or elastic key element and a support which is, at least partially, surrounded by the flexible key element. Here, the key unit includes at least two parts, made up of the support and the key element. The key element can in turn include a number of individual keys, and in particular, an array of individual keys. It is advantageous to assign each individual key a contacting device which in turn communicates with a switching element or else which, on the corresponding activation of the key unit by the user, acts on the respective switching element. The support is advantageously a type of frame for the key element, whereby the key element completely surrounds and covers the support towards the outside area, so that the fixing of the support to the receptacle of the housing is not visible to the user.

It can be of advantage that the key element is stretched over the support, particularly that the key element is pulled over and/or turned up like a stocking over the support. During the application of the flexible key element, the material of the key element is stretched in such a way that the key element can completely surround the geometry of the support. In the fixed state, the key element is stretched on the support, whereby the inner side of the key element is in contact with the surface of the support. In a possible version of the invention, the inner area of the support which is turned away from the outer side of the mobile device is, at least in places, not surrounded by the key element. This means that the key element does not interfere, at least at some section of the support that is turned towards the force transmission area. This section is thus designed free of key elements.

In addition, it can be of advantage to ensure that the key element is designed with at least one contacting device that can extend through a gap of the support, whereby particularly several contacting devices are planned each of which extend due to varying gaps of the support. The gap or gaps can take on different geometric shapes, for example round, square, angular, polygonal. The contacting device is expediently adapted to the geometric shape of the gap, whereby in one possible version of the invention the contacting device is shaped like a plunger and through the respective gaps, extends in the direction of the force transmission area. Advantageously, the free end of the contacting device can be spaced apart from the force transmission area, whereby it is expeditious that the spacing is small. A contacting of the free end of the contacting device with the force transmission area takes place only when the appropriate key unit is operated, through which, due to a deformation of the force transmission area, the switching element is activated. Similarly, it is conceivable that the free end of the contacting device touches the force transmission area even if the key unit is not operated.

It is further conceivable that the support at least has a depression in which a gap is envisaged, whereby at least a section of the depression has a stop function for the key element. Here, it is particularly of advantage that the depression of each gap has a special geometry that serves as a stop for the key element, particularly for each individual key so as to prevent damage, particularly to the switching element, in case the key element is pressed in too far.

Expediently, the force transmission area separates the interior of the housing completely from the outside area. Thus all particles, in particular moisture, dirt etc., are prevented from ingression into the interior of the mobile device in which, for instance, there could be susceptible electronic parts.

In a possible version of the invention, the force transmission area can be designed to be laser transparent, whereby the key unit is laser welded to the force transmission area, in particular that the support is laser welded to the force transmission area. Alternatively, it is conceivable that at least one area of the key element which can extend up to the force transmission area is laser welded to the force transmission area. Advantageously, the material of the force transmission area should be transparent to laser radiation. The part that is to be joined to the force transmission area, particularly the key element or the support, has a material that is designed to absorb laser radiation. In this possible design of the invention, the energy of the laser beam is conveyed through the part to be joined that is transparent to laser radiation, in particular the force transmission area, onto the jointing plane in which the jointing surfaces of the parts to be joined are located. The jointing plane is the boundary layer area between the two parts to be joined, in this case the force transmission area and the support or the key element. There, the electromagnetic energy from the absorbing part to be joined can be converted without loss into heat energy. The energy introduced leads to plasticization of the absorbing part. The transparent part to be joined can also be plasticized through heat conduction. Advantageously, a positive firm bonding takes place between the two parts to be joined. A thin melt film of 10 to 400 µm is formed in the boundary layer. Due to the contactless and locally confined energy supply by way of laser radiation, thermal damage to the joined parts is prevented. Mechanical loading is also avoided since there is no movement relative to each other of the parts being joined during the introduction of energy and the cooling process. The achievable firm bonding features itself in impermeability, freedom from pores and a high level of optical quality and, depending on the pairing of the materials of the parts being joined, in the region of the basic strength of the base materials.

It has been seen that $CO_2$—, Nd:YAG—and diode lasers are particularly suited to joining the parts to be joined. The wave length of a $CO_2$—laser limits optical penetration depths to very small values in the parts to be joined, which are transparent to diode lasers. It has been seen that the optical gap depths can be well adjusted by high pigmentation of the parts to be joined. The advantage of laser welding in comparison with other jointing methods such as adhesive bonding, in which fumes are released, is in the negligible pollution of the workplace. When using high powered diode lasers, the emission wavelengths lie in the region of 800 to 1,000 nm, which can be conveyed, for instance, through optical glass fibers. The glass fiber inserts enable a simple integration of laser and optical processing systems e.g. in a robotics system which, on the one hand can adjust the housing, the key unit and/or the key element in the receptacle and on the other simultaneously introduce the corresponding energy through laser radiation onto the parts to be joined.

It is conceivable that the receptacle is designed as a depression in the housing in which the key unit is located. It can be of further advantage that the surface of the key unit runs almost flush with the surface of the housing. This leads to a very satisfying tactile response (haptic).

The assembly effort is simplified by the fact that the key element is fixed without adhesive onto the support. The key element is only stretched over and/or slipped over the support. The key element is finally located on the support and is held onto this securely and without slippage.

Further, it can be provided for that the housing has an upper and a lower part, whereby the key unit is fixed to the upper part. The upper lower parts can be form-locked and/or force-locked and/or fused to each other. The interior of the mobile device is securely sealed off by the upper and lower parts.

Advantageously, the key element is made elastic is such a way that, after a corresponding activation of the switching element by the contacting device, the key element returns elastically to its original position when a force is no longer acting on the key element from outside. The individual keys of the key element, which can be arranged next to each other, can be separated from each other by appropriate haptic elements. The haptic elements advantageously possess material properties that are different from the individual keys. The haptic elements advantageously form a common structural element with the individual keys, in this case particularly the key element. The haptic element can, for example, be made as a rib or as a grove like depression between the individual keys.

Advantageously, the key element has a protective varnish on the outside. This protective varnish can protect against weather conditions, scratches etc.

In an advantageous embodiment of the invention, the mobile device is an ID-transmitter for a keyless activation of a locking device of a motor vehicle. In this connection, the ID-transmitter can communicate with a passive access authorization system, particularly an access and drive authorization system, of the motor vehicle. For instance, the vehicle and the ID-transmitter can exchange codes with each other, whereby the communication between the ID-transmitter and the motor vehicle can take place over a wireless signal. In particular, the signals are sent out inductively. To advantage, for reasons of safety, the signals can be cryptologically encoded. The said communication can be started manually by key stroke on the ID-transmitter, particularly on the key element, or alternatively without active operation, that is, passively controlled. To ensure that the motor vehicle can be used if the electronics of the ID-transmitter fail, the ID-transmitter appropriately also has a purely mechanical emergency key.

In this case the invention concerns a process for the assembly of a mobile device for the activation of at least one switching element that is arranged inside a housing, with a key unit that has at least one contacting device, whereby the contacting device is directed towards the interior of the housing to be able to activate the switching element, and a receptacle arranged on the housing in which a key unit is fixed. Of particular advantage in this case is that in an initial step, a flexible key element is stretched on a support, from which the key unit is built up. In a further step, the key unit is inserted into the receptacle. Finally, the key unit is laser welded, whereby at least a section of the receptacle is made laser transparent. Beside the simple assembly of the mobile device, the mobile device distinguishes itself by the fact that the interior of the housing is securely sealed from the outside area.

BRIEF DESCRIPTION OF THE DRAWINGS

Other advantages, characteristics and details of the invention can be seen from the descriptions below, in which the invention is described with reference to the drawings. Thereby, the claims and characteristics for the device as per the invention and the process as per the invention mentioned in the description, individually or in any combination, can be essential for the invention. Shown below are:

DETAILED DESCRIPTION

Figure 1:
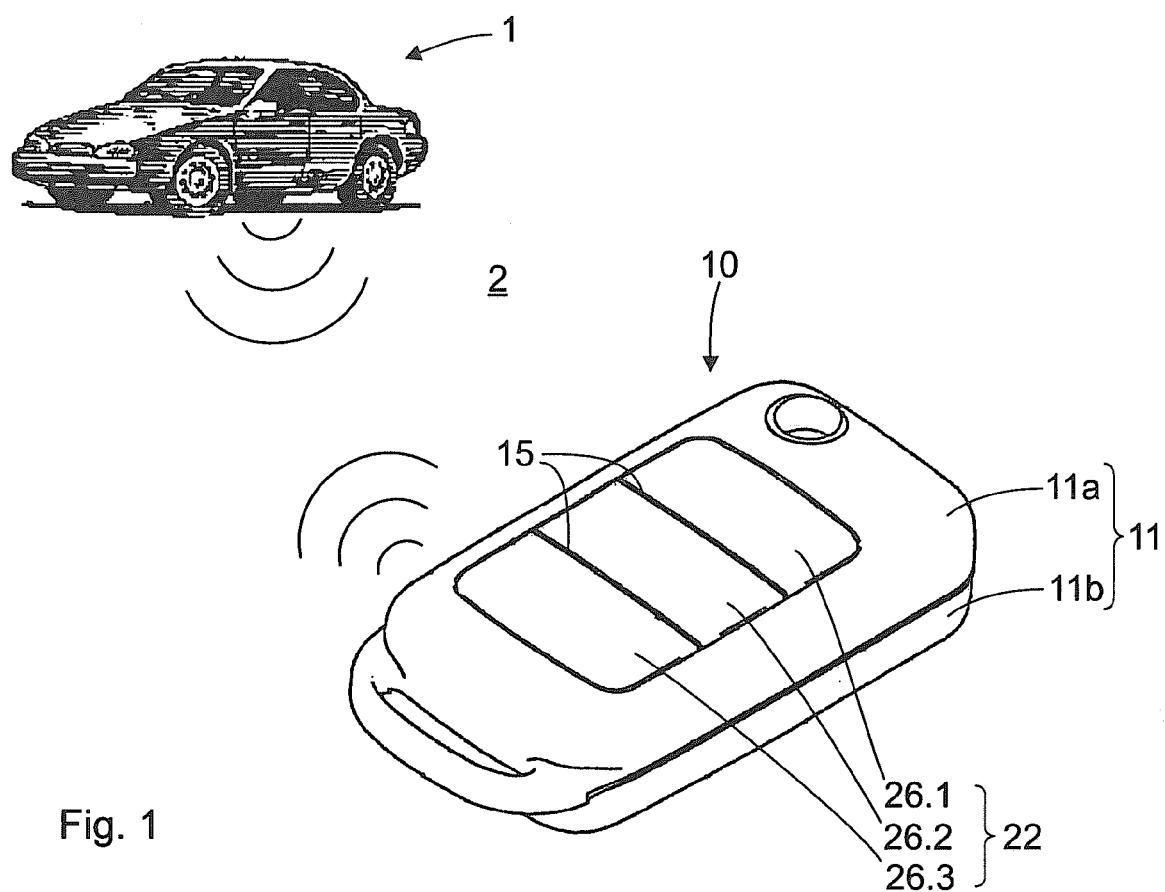
FIG. 1 a schematic representation of a mobile device that is made as an ID-transmitter and serves as a keyless activation of a locking device of a motor vehicle, FIG. 2 a possible design variant of an ID-transmitter as per FIG. 1, FIG. 3 another alternative of the ID-transmitter as per FIG. 1, FIG. 4 a schematic top view of a support as per FIG. 2 or FIG. 3 in which the key unit is inserted and FIG. 5 a schematic representation of the sectional view as per FIG. 4.

FIG. 1 shows a mobile device 10, whereby the device 10 has a housing 11, which comprises an upper part 11a and a lower part 11b. The upper part 11a and the lower part 11b are housing shells that are fixed to one another. In the interior of the housing 11 there is a switching element 40, which is shown exemplarily in FIG. 2 and FIG. 3. This switching element 40 can be activated through a key unit 20, in which the user presses on the key unit 20, which will be further addressed below. The key unit 20 is formed out of a key element 22 and a support 23, which is shown if FIG. 2 and FIG. 3. The key element 22 surrounds the support 23. Here, the edge of the key element 22 is slipped over the support 23. In the present example of the version, the key element 23 has several individual keys 26.1, 26.2, 26.3.

The key unit 20, as per FIG. 2 and FIG. 3, is provided with three contacting devices 21, whereby each contacting device 23 is directed towards the interior 12 of the housing 11. A deformation of the material of the key element 22 takes place if the user exerts a force on the key unit 20 or, in particular, on the any individual key 26, whereby the contacting device 21 moves in the direction of the interior 12.

The key unit 20 is set and fixed in a receptacle 13 of the housing 11. Here, the receptacle 13 has a force transmission area 14 that runs between the key unit 20 and the switching elements 40 that are arranged in the interior 12 of the housing 11. Here, the interior 12 of the housing 11 is completely sealed off from the outside area 2 of the mobile device 10. The housing 11 and the force transmission area 14 form a combined, two-part structural unit, whereby the force transmission area 14 is made out of the first material and the housing 11 is made out of the second material, whereby the first material has a lower mechanical resistance than the second material. Here, the force transmission area has a soft component in its first material. The rest of the housing area on the other hand is designed harder.

As per FIG. 4 and FIG. 5, the support 23 has several gaps 24, through each of which a contacting device 21 projects. Here, a depression 25 is formed on the support 23 at each gap 24. The depression 25 has a curved geometry, whereby, when the key element 22 is not operated, there is a space remaining in front of the curved area of the depression 25. Now, if the key element 22 of any individual key 26 is operated, a deformation takes place so that the contacting device 21 moves in the direction of the force transmission area 14 or of the switching element 40. A contacting of the individual key 26 with the curved area of the depression 25 takes place after a defined stroke length of the individual key 26, which serves as a stop. Due to this, a further depressing of the individual key 26 is prevented, so that damage, particularly to the switching element 40, can be ruled out.

As per FIG. 2, the flexible key element 20 is stretched over the support 23. The significant difference in FIG. 3 is that the support 23 at least has a protrusion 27 on its side, which projects through an opening of the key element 22. Due to this, an additional fastening effect of the key element 20 to the support 23 can be achieved.

As per all versions of the invention, the key unit 20 is laser welded to the force transmission area 14 of the housing 11. Here, the material of the force transmission area 14 is designed to be laser transparent. The parts to be welded together are therefore on the one hand the force transmission area 14 and on the other the support 23. As per FIG. 3, the protrusion 27 of the support 23 is laser welded with the force transmission area 14.

As FIG. 2 and FIG. 3 make clear, the receptacle 13 is made out as a depression in the housing 11, in which the key unit 20 is located. Here the surface of the key unit 20 is arranged almost flush with the surface of the housing 11.

As FIG. 2 exemplarily shows, the force transmission area 14 can be made with various indentations 16, which project in the direction of the support 23 or of the appropriate contacting device 21. Switching elements 40 are located under the force transmission area 14. Each switching element 40 is assigned to a particular individual key 26. The switching elements 40 can be mechanical switches, electromechanical switches, etc. The switching elements 40 are arranged on a circuit board which is not illustrated (no reference number) in the interior 12 of the housing 11. A signal can be triggered by activating the switching element 40, by which in turn different functions are started, for example as per FIG. 1, a locking procedure or an unlocking procedure in a motor vehicle 1.

As per FIG. 1, a haptic element 15 is provided between individual keys 26, which is designed to be so different from the individual keys 26 in its material properties, that the user is exposed to satisfying tactile properties and tactile response of the individual keys 26. In particular, the haptic element 15 causes the individual key 26 to return to its original position after a corresponding operation by the user. The individual keys 26 form a keypad, where the individual keys 26 and the haptic element 15 build a monolithic structural element which is fixed to the support 23 as per FIG. 2 or FIG. 3.

During the assembly of the mobile device 10, in an initial step the key element 10 is stretched onto the support 23, which is made from at harder material than the key element 22, so that the key element 22 is securely fastened to the support 23. The fixing of the key element 22 onto the support 23 is done without adhesive. Finally, the key unit 20 is set into the receptacle 13. The laser welding of the support 23, particularly of the protrusion 27, to the force transmission area 14 follows in the next step.

The invention claimed is:

1. Mobile device for activation of at least one switching element, which is arranged inside a housing, comprising:
a key unit, that has at least one contacting device, whereby the contacting device is directed towards an interior of the housing so activate the switching element, wherein, the key unit is at least made out of a flexible and/or elastic key unit and a support, which is at least partly surrounded by the flexible key unit, wherein, the support has at least one depression, in each of which a gap is delimited, whereby at least a part of the depression has a stop function for the key unit, and
a receptacle arranged in the housing, on which the key unit is fixed, wherein the receptacle has a force transmission area, which is arranged between the key unit and the switching element is such a way, that the interior of the housing is protected from an outer area.

2. Mobile device according to claim 1, wherein, the housing and the force transmission area form a common, two-component structural element.

3. Mobile device according to claim 1, wherein, the force transmission area is made from a first material and the housing from a second material, whereby the first material has a lower mechanical resistance than the second material.

4. Mobile device according to claim 1, wherein, the key unit is stretched over the support, such that the key unit is pulled and/or slipped over the support like a stocking.

5. Mobile device according to claim 1, wherein, the key unit is provided with at least one contacting device, which protrudes through a gap of the support, whereby several contacting devices project through respective gaps of the support.

6. Mobile device according to claim 1, wherein, the force transmission area completely separates the interior of the housing from the outer area.

7. Mobile device according to claim 1, wherein, the force transmission area is made laser transparent, whereby the key unit on the force transmission area is laser welded, such that the support is laser welded to the force transmission area.

8. Mobile device according to claim 1, wherein, the receptacle is made as a depression in the housing in which the key unit is located.

9. Mobile device according to claim 1, wherein, the surface of the key unit runs almost flush with the surface of the housing.

10. Mobile device according to claim 1, wherein, the key unit is fixed free of adhesive to the support.

11. Mobile device according to claim 1, wherein, the housing comprises an upper part and a lower part, whereby the key unit is fixed to the upper part.

12. Mobile device according to claim 1, wherein, the device is an ID-transmitter for keyless activation of a locking system of a motor vehicle.

13. Method for assembly of a mobile device for the activation of at least one switching element, that is arranged inside a housing, with a key unit that has at least one contacting device, whereby the contacting device is directed towards the interior of the housing, to activate the switching element, wherein, the key unit is at least made out of a flexible and/or elastic key unit and a support, which is at least partly surrounded by the flexible key unit, wherein, the support has at least one depression, in each of which a gap is delimited, whereby at least a part of the depression has a stop function for the key unit, and a receptacle arranged on the housing to which the key unit is fixed, the method comprising:
(1) stretching a flexible key unit over a support, by which the key unit is formed,
(2) setting the key unit into the receptacle, and
(3) laser welding the key unit into the receptacle, whereby at least a part of the receptacle is made laser transparent.

14. Method according to claim 13, wherein the mobile device, comprises:
a key unit, that has at least one contacting device, whereby the contacting device is directed towards an interior of the housing so activate the switching element, and a receptacle arranged in the housing, on which the key unit is fixed, wherein the receptacle has a force transmission area, which is arranged between the key unit and the switching element is such a way, that the interior of the housing is protected from an outer area.

* * * * *